United States Patent
Kwon et al.

(10) Patent No.: US 11,531,496 B2
(45) Date of Patent: Dec. 20, 2022

(54) MEMORY MODULES AND MEMORY SYSTEMS HAVING THE SAME

(71) Applicant: Samsung Electronics Co., Ltd., Suwon-si (KR)

(72) Inventors: Yongsuk Kwon, Goyang-si (KR); Jinin So, Hwaseong-si (KR); Jonggeon Lee, Seoul (KR); Kyungsoo Kim, Seoul (KR); Jin Jung, Seoul (KR); Jeonghyeon Cho, Hwaseong-si (KR)

(73) Assignee: Samsung Electronics Co., Ltd.

( * ) Notice: Subject to any disclaimer, the term of this patent is extended or adjusted under 35 U.S.C. 154(b) by 148 days.

(21) Appl. No.: 17/154,030

(22) Filed: Jan. 21, 2021

(65) Prior Publication Data

US 2022/0027090 A1 Jan. 27, 2022

(30) Foreign Application Priority Data

Jul. 22, 2020 (KR) ......................... 10-2020-0091034

(51) Int. Cl.
   *G06F 3/06* (2006.01)
   *G06F 1/08* (2006.01)

(52) U.S. Cl.
   CPC .............. *G06F 3/0659* (2013.01); *G06F 1/08* (2013.01); *G06F 3/0604* (2013.01); *G06F 3/0656* (2013.01); *G06F 3/0673* (2013.01)

(58) Field of Classification Search
   CPC .... G06F 3/0659; G06F 3/0604; G06F 3/0656; G06F 3/0673; G06F 1/08; G11C 7/1057; G11C 7/1084; G11C 7/222
   See application file for complete search history.

(56) References Cited

U.S. PATENT DOCUMENTS

| | | | |
|---|---|---|---|
| 3,611,003 A | 10/1971 | Frye | |
| 4,816,776 A * | 3/1989 | Kessler | ............... G06F 11/1604 331/49 |
| 5,463,591 A | 10/1995 | Aimoto et al. | |
| 6,779,075 B2 | 8/2004 | Wu et al. | |
| 7,171,508 B2 | 1/2007 | Choi | |
| 8,756,364 B1 | 6/2014 | Bhakta et al. | |

(Continued)

FOREIGN PATENT DOCUMENTS

| | | |
|---|---|---|
| DE | 10023102 A1 | 11/2001 |
| GB | 1313707 A | 4/1973 |

*Primary Examiner* — Ramon A. Mercado
(74) *Attorney, Agent, or Firm* — Myers Bigel, P.A.

(57) ABSTRACT

Memory modules and memory systems having the same are provided. A memory module may include command/address terminals, data terminals, at least one monitoring terminal, a buffer, and a plurality of semiconductor memory devices. The buffer may be configured to receive and buffer data applied through the data terminals and a command/address applied through the command/address terminals to generate buffered write data and a buffered command/address. The buffer may be configured to buffer the buffered write data and the buffered command/address to generate module data and a module command/address, and store and then transmit at least one portion of the buffered write data as monitoring data through the at least one monitoring terminal. The plurality of semiconductor memory devices may be configured to receive and store the module data in response to the module command/address.

20 Claims, 12 Drawing Sheets

(56) References Cited

U.S. PATENT DOCUMENTS

| | | | |
|---|---|---|---|
| 9,502,086 B1 | 11/2016 | Simon et al. | |
| 9,666,263 B2 | 5/2017 | Hanson | |
| 11,157,180 B2* | 10/2021 | Ma | G06F 3/0655 |
| 2002/0174274 A1 | 11/2002 | Wu et al. | |
| 2004/0215421 A1* | 10/2004 | Schmitz | G06F 11/221 |
| | | | 702/183 |
| 2005/0185492 A1* | 8/2005 | Harrand | G11C 7/1084 |
| | | | 714/E11.034 |
| 2006/0041704 A1 | 2/2006 | Choi | |
| 2010/0162068 A1* | 6/2010 | Toda | G11C 13/0004 |
| | | | 714/747 |
| 2017/0103796 A1 | 4/2017 | Hanson | |
| 2018/0088812 A1* | 3/2018 | Lee | G06F 3/064 |
| 2018/0150242 A1* | 5/2018 | Yi | G06F 3/0656 |
| 2019/0130950 A1* | 5/2019 | Kim | G11C 7/1087 |
| 2020/0151055 A1* | 5/2020 | Eom | G06F 3/0619 |
| 2021/0158887 A1* | 5/2021 | Eva | G06F 11/1048 |
| 2022/0027090 A1* | 1/2022 | Kwon | G06F 3/0604 |

* cited by examiner

MEMORY MODULES AND MEMORY SYSTEMS HAVING THE SAME

CROSS-REFERENCE TO RELATED APPLICATION

This application claims priority from Korean Patent Application No. 10-2020-0091034, filed on Jul. 22, 2020, in the Korean Intellectual Property Office, the disclosure of which is incorporated by reference herein in its entirety.

BACKGROUND

1. Technical Field

The present disclosure relates to memory modules and to memory systems having the same.

2. Description of the Related Art

A memory system may include a control unit and a memory module. The control unit may be, for example, a central processing unit (CPU), a graphic processing unit (GPU), and so on.

The memory module may include a plurality of semiconductor memory devices mounted on a memory board. Further, the memory module may include a buffer configured to receive and buffer data and/or a command/address transmitted from the control unit to transmit them to the plurality of semiconductor memory devices.

A technology for externally monitoring the data and/or the command/address transmitted from the control unit to the memory module may be desirable, as may be a technology that enables the memory module to support an external apparatus, (for example, a monitoring apparatus) so that the external apparatus may more easily monitor the data and/or the command/address transmitted from the control unit.

SUMMARY

The example embodiments of the disclosure provide memory modules that may be configured to support an external apparatus to enable the external apparatus to monitor data and/or command/address transmitted from a control unit, and provide memory systems having the same.

The disclosure is not limited to the aforementioned objects and the examples of embodiments disclosed herein, and other objects and embodiments will be clearly understood by those skilled in the art based on the following description of the disclosure.

According to some example embodiments of the inventive concepts, a memory module may include: a first plurality of terminals, comprising a plurality of command/address terminals; a second plurality of terminals, comprising a plurality of data terminals; at least one monitoring terminal; a buffer configured to receive and buffer a second plurality of bits of data applied through the data terminals to generate a second plurality of bits of buffered write data and configured to receive and buffer a first plurality of bits of command/address applied through the command/address terminals to generate a first plurality of bits of buffered command/address. The buffer is further configured to buffer the second plurality of bits of buffered write data and the first plurality of bits of buffered command/address to generate module data and a module command/address, store at least one portion of the second plurality of bits of buffered write data, and transmit the at least one portion of the stored second plurality of bits of buffered write data as monitoring data through at least one monitoring terminal. The memory module further comprises a plurality of semiconductor memory devices configured to receive and store the module data in response to the module command/address.

According to some example embodiments of the inventive concepts, a memory module may include: a first plurality terminals, comprising a plurality of command/address terminals; a second plurality of terminals, comprising a plurality of data terminals; at least one monitoring terminal; a buffer configured to receive and buffer data applied through the data terminals and a command/address applied through the command/address terminals to generate buffered write data and a buffered command/address. The buffer is further configured to buffer the buffered write data and the buffered command/address to generate module data and a module command/address. The memory module further comprises a storage and processing unit configured to store at least one portion of the buffered write data, and transmit the stored at least one portion of the buffered write data as monitoring data through the at least one monitoring terminal. The memory module further comprises a plurality of semiconductor memory devices configured to receive and store the module data in response to the module command/address.

According to some example embodiments of the inventive concepts, a memory system may include a control unit that includes a processor configured to execute a program to generate an internal command, an internal address, and internal data, a clock signal generator configured to generate a clock signal, a command/address generator configured to receive the internal command and the internal address to generate a first plurality of bits of command/address, in response to the clock signal, and a data output unit configured to receive the internal data to generate a second plurality of bits of data. The memory system may also include a memory module that may include a first plurality of terminals, comprising a plurality of command/address terminals, a second plurality of terminals, comprising a plurality of data terminals, at least one monitoring terminal, a buffer configured to receive and buffer the second plurality of bits of data applied through the data terminals and the first plurality of bits of command/address applied through the command/address terminals to generate a second plurality of bits of buffered write data and a first plurality of bits of buffered command/address, with the buffer further configured to buffer the second plurality of bits of buffered write data and the first plurality of bits of buffered command/address to generate module data and a module command/address. The memory module may also include a storage and processing unit configured to store at least one of the second plurality of bits of buffered write data, and transmit the stored at least one portion of the second plurality of bits of buffered write data as monitoring data through the at least one monitoring terminal. The memory module may also include a plurality of semiconductor memory devices configured to receive and store the module data in response to the module command/address.

DETAILED DESCRIPTION

Hereinafter, a memory module and a memory system having the same according to some example embodiments of the inventive concepts will be described with reference to the accompanying drawings.

Figure 1:
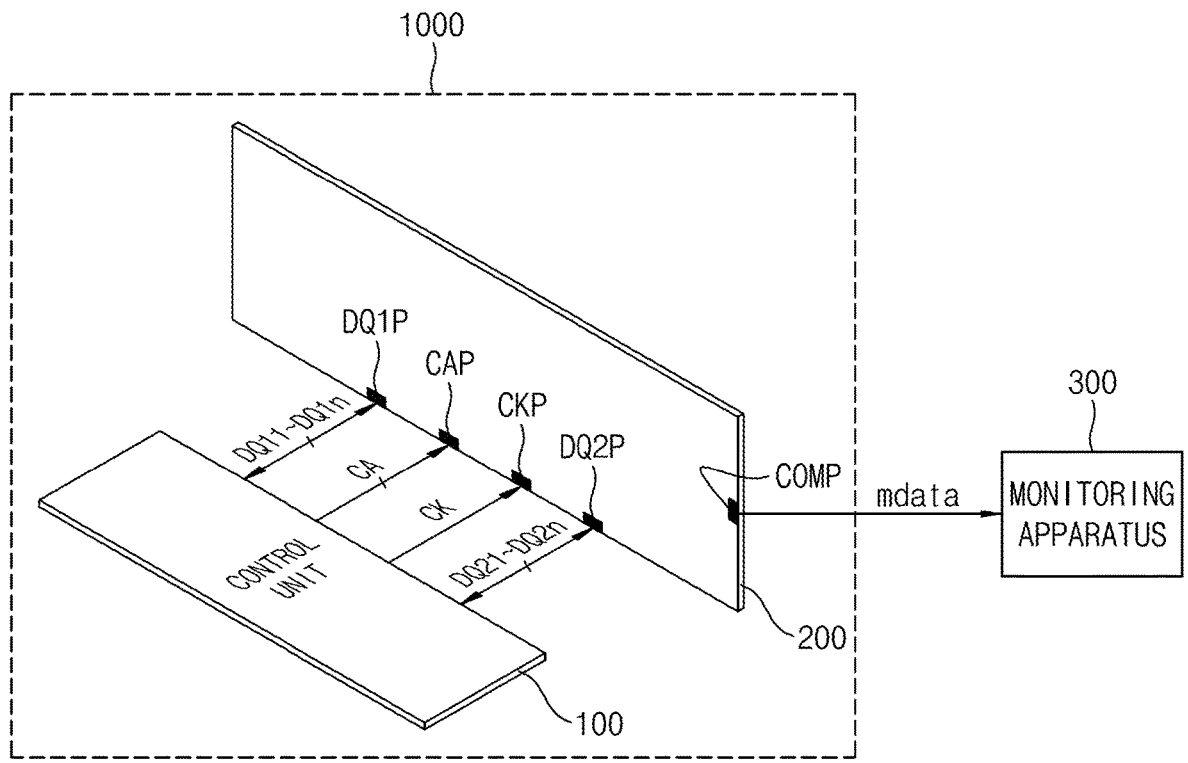
FIG. 1 is a block diagram illustrating a configuration of a memory system according to some example embodiments of the inventive concepts.

FIG. 1 is a block diagram illustrating a configuration of a memory system according to some example embodiments of the inventive concepts. The memory system 1000 may include a control unit 100 and at least one memory module 200. A monitoring apparatus 300 may be connected outside the memory system 1000.

In FIG. 1, the control unit 100 may be, for example, a central processing unit (CPU) or a graphic processing unit (GPU), or the like. The control unit 100 may transmit a clock signal CK and a first plurality of bits of command/address CA CK to the at least one memory module 200. The control unit 100 may also send to and/or receive from the at least one memory module 200 a second plurality of bits of data DQ11 to DQ1*n* and DQ21 to DQ2*n*. Herein, n may be a natural number greater than or equal to 1. In some embodiments, the second plurality of bits of data DQ11 to DQ1*n* may include first channel data DQ11 to DQ1*n* and second channel data DQ21 to DQ2*n*. The first channel data DQ11 to DQ1*n* may include a first predetermined number of bits of first data and a second predetermined number of bits of a first error correction code (ECC), and the second channel data DQ21 to DQ2*n* may include a first predetermined number of bits of second data and a second predetermined number of bits of a second ECC. As one example, the first channel data DQ11 to DQ1*n* may comprise 32-bit first data and an 8-bit first ECC, and the second channel data DQ21 to DQ2*n* may comprise 32-bit second data and 8-bit second ECC. As another example, the second plurality of bits of data DQ11 to DQ1*n* and DQ21 to DQ2*n* may include 64-bit data and 8-bit ECC. In some embodiments, the number of bits of first channel data DQ11 to DQ1*n* may not equal the number of bits of second channel data DQ21 to DQ2*n*.

The at least one memory module 200 may receive and store the first plurality of bits of command/address CA applied through one or more terminals CAP, and the clock signal CK applied through one or more clock terminals CKP. The at least one memory module 200 may receive and store the second plurality of bits of data DQ11 to DQ1*n* and DQ21 to DQ2*n* applied through a second plurality of data terminals DQ1P and DQ2P when a command included in the first plurality of bits of command/address CA is a write command, and may transmit a stored second plurality of bits of data DQ11 to DQ1*n* and DQ21 to DQ2*n* through the second plurality of data terminals DQ1P and DQ2P when the command included in the first plurality of bits of command/address CA is a read command. Further, the at least one memory module 200 may transmit at least one portion of the second plurality of bits of data DQ11 to DQ1*n* and DQ21 to DQ2*n* applied through the second plurality of data terminals DQ1P and DQ2P and/or at least one portion of the first plurality of bits of command/address CA applied through the first plurality of command/address terminals CAP as monitoring data mdata through a monitoring terminal COMP to the monitoring apparatus 300.

Figure 2:
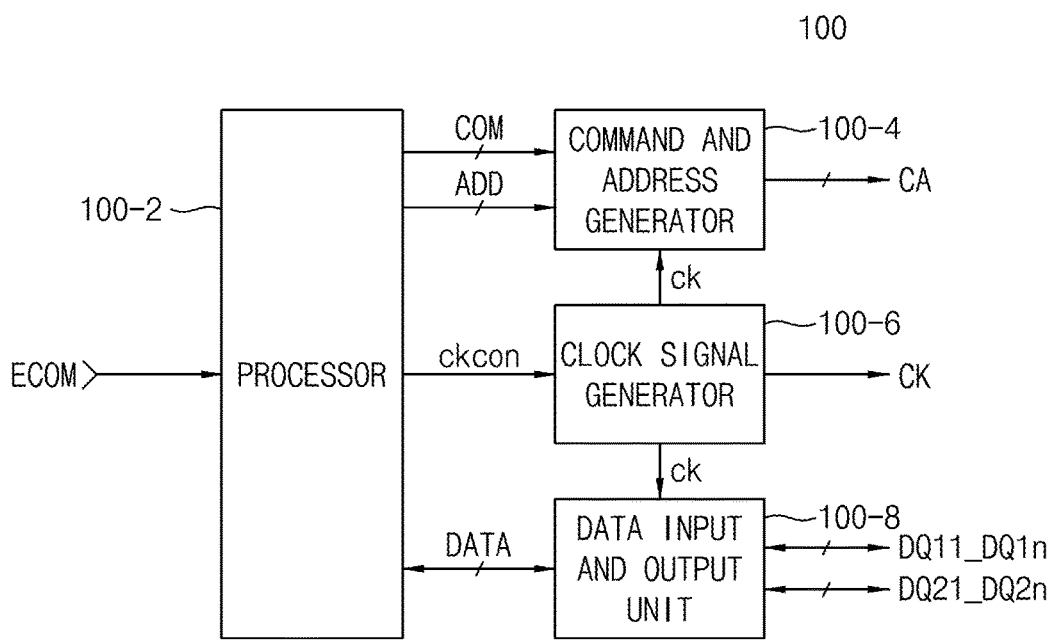
FIG. 2 is a diagram illustrating a configuration of a control unit according to some example embodiments of the inventive concepts.

FIG. 2 is a block diagram illustrating a configuration of a control unit according to some example embodiments of the inventive concepts. The control unit 100 may include a processor 100-2, a command and address generator 100-4, a clock signal generator 100-6, and a data input and output unit 100-8. A function of each of the blocks shown in FIG. 2 will be described below.

The processor 100-2 may execute a program according to an external command ECOM, generate a command COM and an address ADD, and transceive (e.g., transmit and/or receive) data DATA. For example, the processor 100-2 may communicate with various input devices (not shown), for example, a keyboard, a mouse, a touch sensor, or a sound, fingerprint or motion recognition sensor, and so on, to receive the external command ECOM. The processor 100-2 may execute the program according to the external command ECOM to generate a command COM, an address ADD, and data DATA, and receive and process the data DATA to output various output devices (not shown), for example, a display unit, or a sound output unit, etc. Further, the processor 100-2 may further generate a clock signal control signal ckcon.

The command and address generator 100-4 may receive the command COM and the address ADD from the processor 100-2 to generate a first plurality of bits of command/address CA, in response to an internal clock signal ck. For example, the command and address generator 100-4 may generate the first plurality of bits of command/address CA according to a double data rate (DDR) protocol in response to the internal clock signal ck. The first plurality of bits of command/address CA may be generated in response to a rising edge and a falling edge of a clock signal CK, according to the DDR protocol.

The clock signal generator 100-6 may generate the internal clock signal ck and the clock signal CK in response to the clock signal control signal ckcon received from the processor 100-2.

The data input and output unit 100-8 may receive the data DATA from the processor 100-2 to generate a second plurality of bits of data DQ11 to DQ1*n* and DQ21 to DQ2*n*, or receive the second plurality of bits of data DQ11 to DQ1n and DQ21 to DQ2n to generate the DATA for transmission to the processor 100-2, in response to the internal clock signal ck. For example, the data input and output unit 100-8 may generate the second plurality of bits of data DQ11 to DQ1n and DQ21 to DQ2n in response to the internal clock signal ck according to the DDR protocol. For example, the second plurality of bits of data DQ11 to DQ1n and DQ21 to DQ2n may be sequentially input or output by a number corresponding to a predetermined burst length, for example, 4, 8, 16, etc. in response to the rising edge and the falling edge of the clock signal CK.

Figure 3:
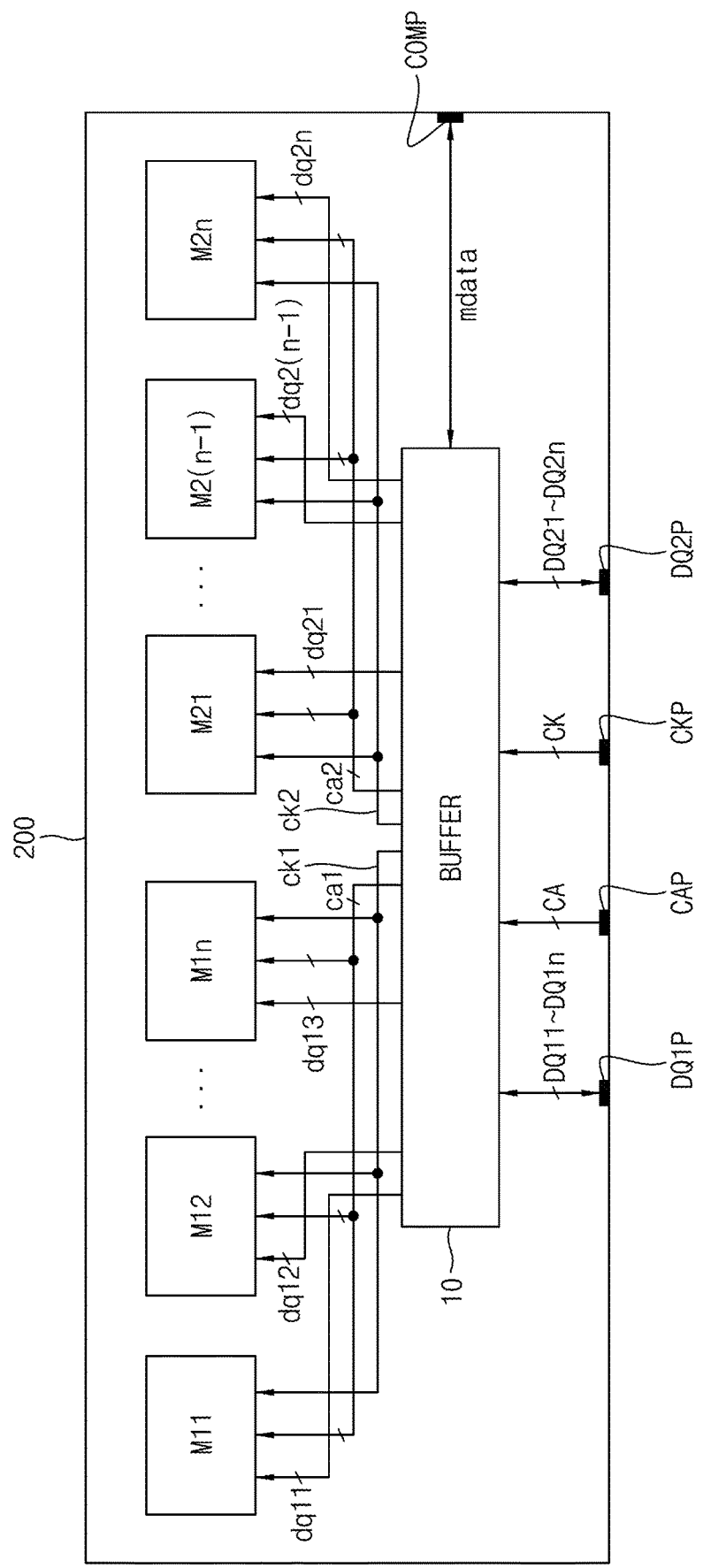
FIG. 3 is a block diagram illustrating a configuration of a memory module according to some example embodiments of the inventive concepts.

FIG. 3 illustrates a configuration of a memory module according to some example embodiments of the inventive concepts. The memory module 200 may include a buffer 10, 2n semiconductor memory devices M11 to M1n and M21 to M2n, a first plurality of command/address terminals CAP, a second plurality of data terminals DQ1P and DQ2P, a clock signal terminal CKP, and at least one monitoring terminal COMP.

Referring to FIG. 3, the buffer 10 may receive and buffer the first plurality of bits of command/address CA, the second plurality of bits of data DQ11 to DQ1n and DQ21 to DQ2n, and the clock signal CK transmitted from the control unit 100 through the first plurality of command/address terminals CAP, the second plurality of data terminals DQ1P and DQ2P, and the clock signal terminal CKP respectively. The buffer 10 may then transmit module command/addresses caa and cab, module data dq11 to dq1n and dq21 to dq2n, and module clock signals cka and ckb to the 2n semiconductor memory devices M11 to M1n and M21 to M2n. When the memory module 200 is commanded to transmit data to the control unit 100, the buffer 10 may receive and buffer module data dq11 to dq1n and dq21 to dq2n output from the 2n semiconductor memory devices M11 to M1n and M21 to M2n to transmit the second plurality of bits of data DQ11 to DQ1n and DQ21 to DQ2n to the control unit 100 through the second plurality of data terminals DQ1P and DQ2P. The buffer 10 may commonly transmit the module command/address caa and the module clock signal cka to the n semiconductor memory devices M11 to M1n, and may commonly transmit the module command/address cab and the module clock signal ckb to the n semiconductor memory devices M21 to M2n. The buffer 10 may transmit the module data dq11 to dq1n to the n semiconductor memory devices M11 to M1n, respectively, and transmit the module data dq21 to dq2n to the n semiconductor memory devices M21 to M2n, respectively, during a write operation. Further, the buffer 10 may receive and buffer the module data dq11 to dq1n to generate the data DQ11 to DQ1n through the data terminals DQ1P, and may receive and buffer the module data dq21 to dq2n to the data DQ21 to DQ2n through the data terminals DQ2P, during a read operation.

Further, the buffer 10 may receive and store at least one portion of the first plurality of bits of command/address CA and/or at least one portion of the second plurality of bits of data DQ11 to DQ1n and DQ21 to DQ2n, and may output as monitoring data mdata the stored at least one portion of the first plurality of bits of command/address CA and/or the stored at least one portion of the second plurality of bits of data DQ11 to DQ1n and DQ21 to DQ2n. The monitoring data mdata may be output to the monitoring apparatus 300 shown in FIG. 1 through the monitoring terminal COMP, during a normal operation, for example, the write operation and the read operation. In some embodiments, the buffer 10 may receive and store at least one portion of the first plurality of bits of command/address CA and/or at least one portion of the second plurality of bits of data DQ11 to DQ1n and DQ21 to DQ2n, during the normal operation, and output at the stored at least one portion of the first plurality of bits of command/address CA and/or the stored at least one portion of the second plurality of bits of data DQ11 to DQ1n and DQ21 to DQ2n as the monitoring data mdata through the monitoring terminal COMP, in response to a request of the monitoring apparatus 300.

Figure 4:
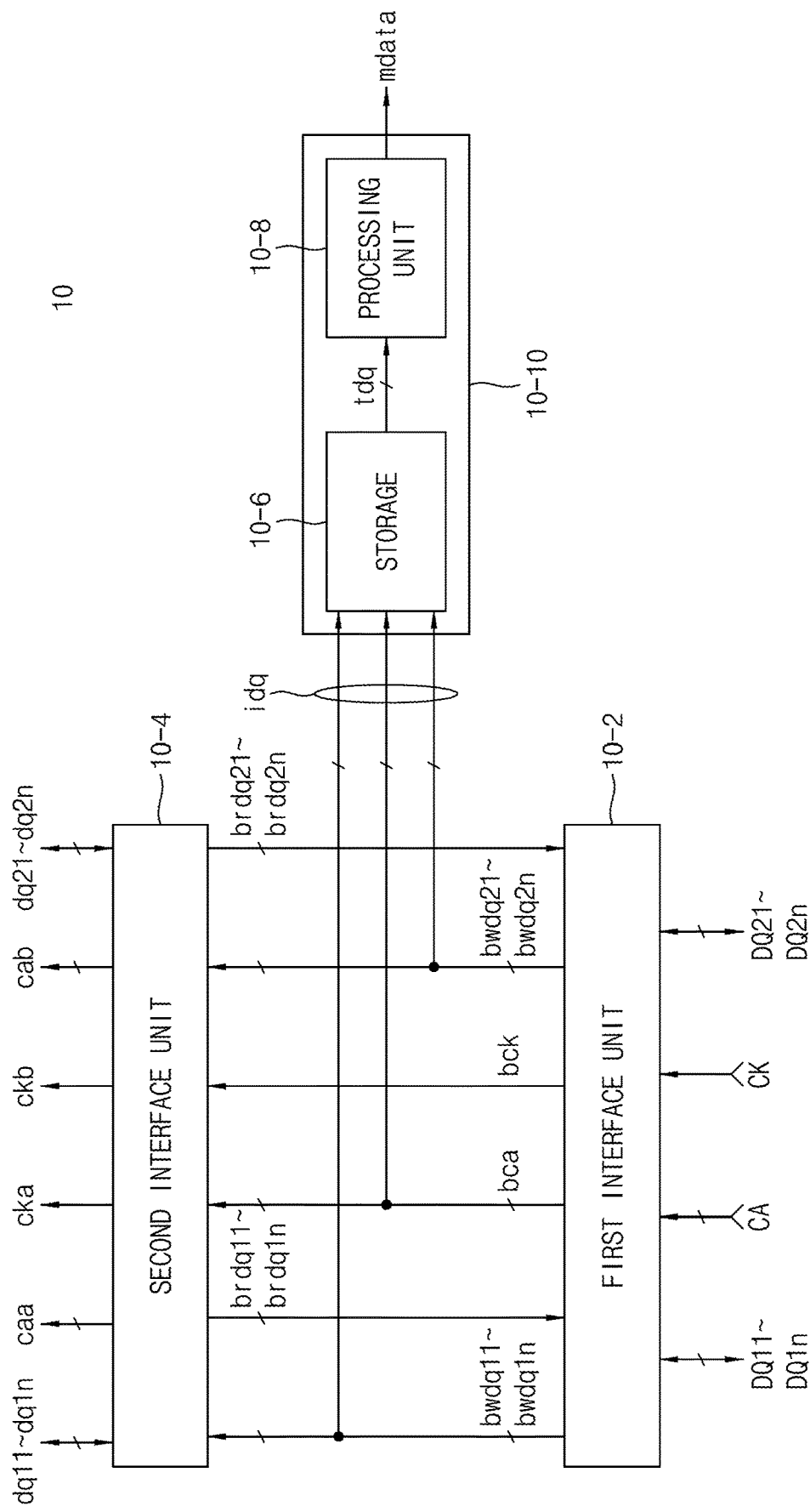
FIG. 4 is a block diagram illustrating a configuration of a buffer according to some example embodiments of the inventive concepts.

FIG. 4 is a block diagram illustrating a configuration of a buffer 10 according to some example embodiments of the inventive concepts. The buffer 10 may include a first interface unit 10-2, a second interface unit 10-4, and a storage and processing unit 10-10. The storage and processing unit 10-10 may include a storage 10-6 and a processing unit 10-8.

In FIG. 4, the first interface unit 10-2 may receive and buffer the second plurality of bits of data DQ11 to DQ1n and DQ21 to DQ2n, the first plurality of bits of command/address CA, and the clock signal CK. Based thereon, the first interface unit 10-2 may generate a second plurality of bits of buffered write data bwdq11 to bwdq1n and bwdq21 to bwdq2n, a first plurality of bits of buffered command/address bca, and a buffered clock signal bck. Additionally, or alternatively, the buffer 10 receive and buffer a second plurality of bits of read data brdq11 to brdq1n and brdq21 to brdq2n to generate the second plurality of bits of data DQ11 to DQ1n and DQ21 to DQ2n. For example, the first interface unit 10-2 may convert the second plurality of bits of data DQ11 to DQ1n and DQ21 to DQ2n, the first plurality of bits of command/address CA, and the clock signal CK, which may be in an analog form, into a second plurality of bits of buffered write data bwdq11 to bwdq1n and bwdq21 to bwdq2n, a first plurality of bits of buffered write command/address bca, and a buffered clock signal bck, which may be in a digital form. Additionally, or alternatively, the first interface unit 10-2 may convert levels of a second plurality of bits of buffered read data brdq11 to brdq1n and brdq21 to brdq2n, which may be in a digital form, into a proper level for the control unit 100 shown in FIG. 1 to generate the second plurality of bits of data DQ11 to DQ1n and DQ21 to DQ2n. The first interface unit 10-2 may thus in some embodiments implement an analog to digital converter (ADC) and/or a digital to analog converter (DAC)

The second interface unit 10-4 may receive and buffer the second plurality of bits of buffered write data bwdq11 to bwdq1n and bwdq21 to bwdq2n, the first plurality of bits of buffered command/address bca, and the buffered clock signal bck, and based thereon may generate module data dq11 to dq1n and dq21 to dq2n, module command/addresses caa and cab, and module clock signals cka and ckb. Additionally, or alternatively, the second interface unit 10-4 may receive and buffer the module data dq11 to dq1n and dq21 to dq2n to generate a second plurality of bits of buffered read data brdq11 to brdq1n and brdq21 to brdq2n. For example, the second interface unit 10-4 may convert levels of the second plurality of bits of buffered write data bwdq11 to bwdq1n and bwdq21 to bwdq2n, the first plurality of bits of command/address bca and the buffered clock signal bck, which may be in a digital form, into a proper level for the 2n semiconductor memory devices M11 to M1n and M21 to M2n to generate the module data dq11 to dq1n and dq21 to dq2n, the module command/addresses caa and cab, and the module clock signals cka and ckb.

The storage and processing unit 10-10 may receive and store a third plurality of bits of data idq corresponding to at least one portion of the second plurality of bits of buffered write data bwdq11 to bwdq1n and bwdq21 to bwdq2n and/or corresponding to at least one portion of the first plurality of bits of buffered command/address bca to output the stored third plurality of bits of data idq as the monitoring data mdata.

The storage 10-6 may store the third plurality of bits of data idq, and may output to the processing unit 10-8 the stored third plurality of bits of data idq as a fourth plurality of bits of data tdq. The storage 10-6 may perform a write operation storing the third plurality of bits of data idq and a read operation outputting the fourth plurality of bits of data tdq by using a first-in first-out (FIFO) method. The storage 10-6 may be a dual port memory including a first port and a second port which are independent from each other, and in some embodiments may be configured to perform simultaneously a write operation and a read operation via the first and second ports. For example, the storage 10-6 may perform a write operation in which the third plurality of bits of data idq is received through the first port and written while performing a read operation in which the fourth plurality of data tdq is read and output through the second port. The first port may comprise a number of input terminals, and the second port may comprise a number of output terminals. The number of provided input terminals and/or output terminals may be related to a size of the first plurality of bits and/or the second number of bits. For example, the number of input terminals of the first port and the number of output terminals of the second port may each be 72 the first plurality of bits may be 10 bits, the second plurality of bits may be 72 bits, the third plurality of bits may be 72 bits or less and the number of the fourth plurality of bits may be the same as or smaller than that of the third plurality of bits, e.g., the third plurality of bits may be 72 bits and the fourth plurality of bits may be 8 bits. The storage 10-6 may perform the write operation storing the third plurality of bits of data idq, and perform the read operation outputting the fourth plurality of bits of data tdq when there is a read request from the processing unit 10-8.

The processing unit 10-8 may receive the fourth plurality of bits of data tdq from the storage 10-6 and may transmit the fourth plurality of bits of data tdq as the monitoring data mdata. For example, the processing unit 10-8 may receive the fourth plurality of bits of data tdq, and convert the received data into serial data to output the monitoring data mdata in series.

Figure 5:
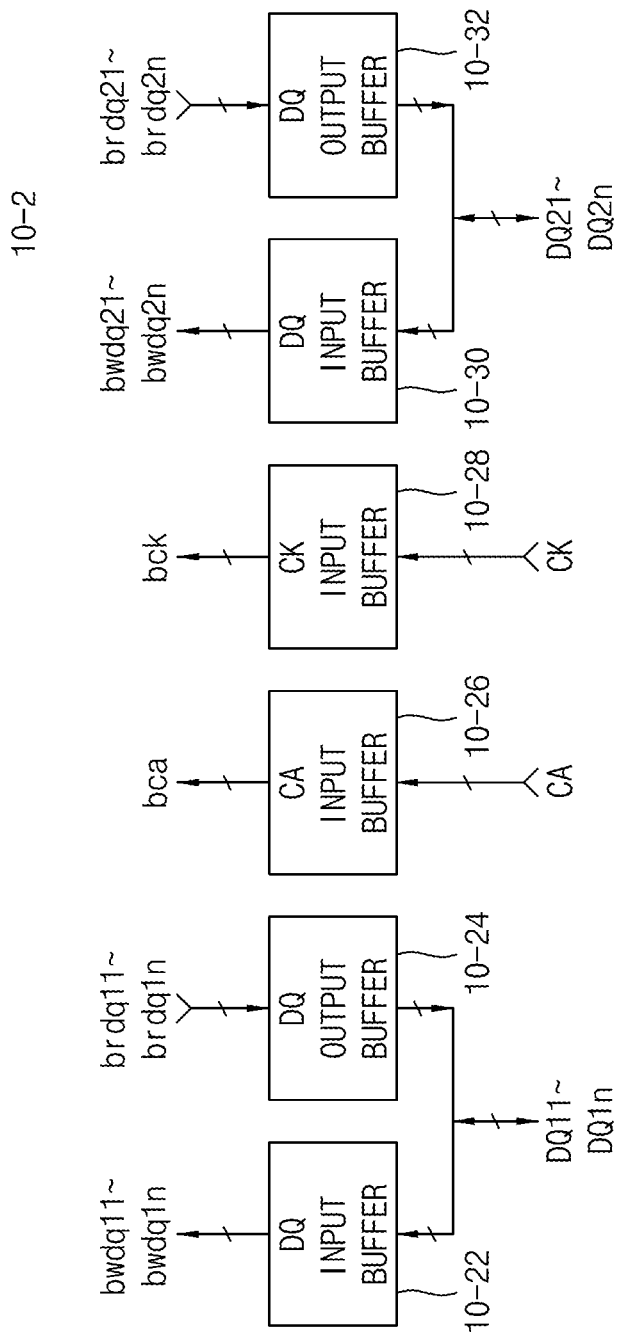
FIG. 5 is a block diagram illustrating a configuration of an interface unit according to some example embodiments of the inventive concepts.

FIG. 5 is a block diagram illustrating a configuration of the first interface unit 10-2 according to some example embodiments of the inventive concepts. The first interface unit 10-2 may include data (DQ) input buffers 10-22, 10-30, DQ output buffers 10-24, 10-32, a command/address (CA) input buffer 10-26, and a clock signal input buffer 10-28. A function of each of the blocks shown in FIG. 5 is described below.

The DQ input buffer 10-22 may buffer the data DQ11 to DQ1$n$ to generate the buffered write data bwdq11 to bwdq1$n$. The DQ output buffer 10-24 may buffer the buffered read data brdq11 to brdq1$n$ to generate the data DQ11 to DQ1$n$. The CA input buffer 10-26 may buffer the first plurality of bits of command/address CA to generate the first plurality of bits of buffered command/address bca. The CK input buffer 10-28 may buffer the clock signal CK to generate the buffered clock signal bck. The DQ input buffer 10-30 may buffer the data DQ21 to DQ2$n$ to generate the buffered write data bwdq21 to bwdq2$n$. The DQ output buffer 10-32 may buffer the buffered read data brdq21 to brdq2$n$ to generate the data DQ21 to DQ2$n$.

In some embodiments, the control unit 100 shown in FIG. 1 may transmit the signal which may be in the digital form, but in some situations the signal may become distorted, which may result in a signal which is the analog form. The DQ input buffers 10-22, 10-30, the CA input buffer 10-26, and the CK input buffer 10-28 shown in FIG. 5 may buffer the second plurality of bits of data DQ11 to DQ1$n$ and DQ21 to DQ2$n$, the first plurality of bits of command/address CA, and the clock signal CK which are received in analog form at the memory module 200, and may convert the received analog-form data into digital data. Further, the DQ output buffers 10-24, 10-32 shown in FIG. 5 may convert levels of the second plurality of bits of buffered read data brdq11 to brdq1$n$ and brdq21 to brdq2$n$ into a proper level for the control unit 100 shown in FIG. 1.

Figure 6:
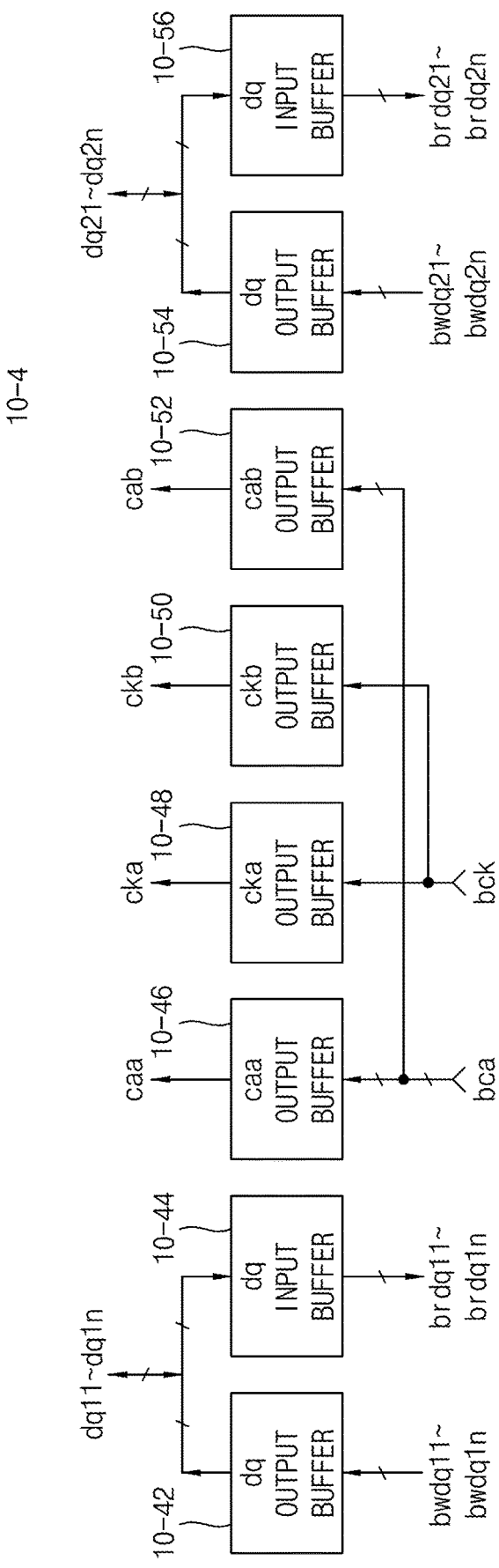
FIG. 6 is a block diagram illustrating a configuration of a second interface unit according to some example embodiments of the inventive concepts.

FIG. 6 is a block diagram illustrating a configuration of the second interface unit 10-4 according to some example embodiments of the inventive concepts. The second interface unit 10-4 may include module data (dq) output buffers 10-42 and 10-54, module command/address (caa, cab) output buffers 10-46 and 10-52, module clock signal (cka, ckb) output buffers 10-48 and 10-50, and dq input buffers 10-44 and 10-56. A function of each of the blocks shown in FIG. 6 is described below.

The dq output buffer 10-42 may buffer the buffered write data bwdq11 to bwdq1$n$ to generate the module data dq11 to dq1$n$. The dq input buffer 10-44 may buffer the module data dq11 to dq1$n$ to generate the buffered read data brdq11 to brdq1$n$. The caa output buffer 10-46 may buffer the buffered command/address bca to generate the module command/address caa. The cka output buffer 10-48 may buffer the buffered clock signal bck to generate the module clock signal cka. The ckb output buffer 10-50 may buffer the buffered clock signal bck to generate the module clock signal ckb. The cab output buffer 10-52 may buffer the buffered command/address bca to generate the module command/address cab. The dq output buffer 10-54 may buffer the buffered write data bwdq21 to bwdq2$n$ to generate the module data dq21 to dq2$n$. The dq input buffer 10-56 may buffer the module data dq21 to dq2$n$ to generate the buffered read data brdq21 to brdq2$n$.

The dq output buffers 10-42 and 10-54, the caa and cab output buffers 10-46 and 10-52, and the cka and ckb output buffers 10-48 and 10-50 shown in FIG. 6 may convert levels of the second plurality of bits of buffered write data bwdq11 to bwdq1$n$ and bwdq21 to bwdq2$n$, the first plurality of bits of buffered command/address bca, and the buffered clock signal bck into proper levels for the 2$n$ semiconductor memory devices M11 to M1$n$ and M21 to M2$n$ shown in FIG. 3 to generate the module data dq11 to dq1$n$ and dq21 to dq2$n$, the module command/addresses caa and cab, and the module clock signals cka and ckb.

Figure 7:
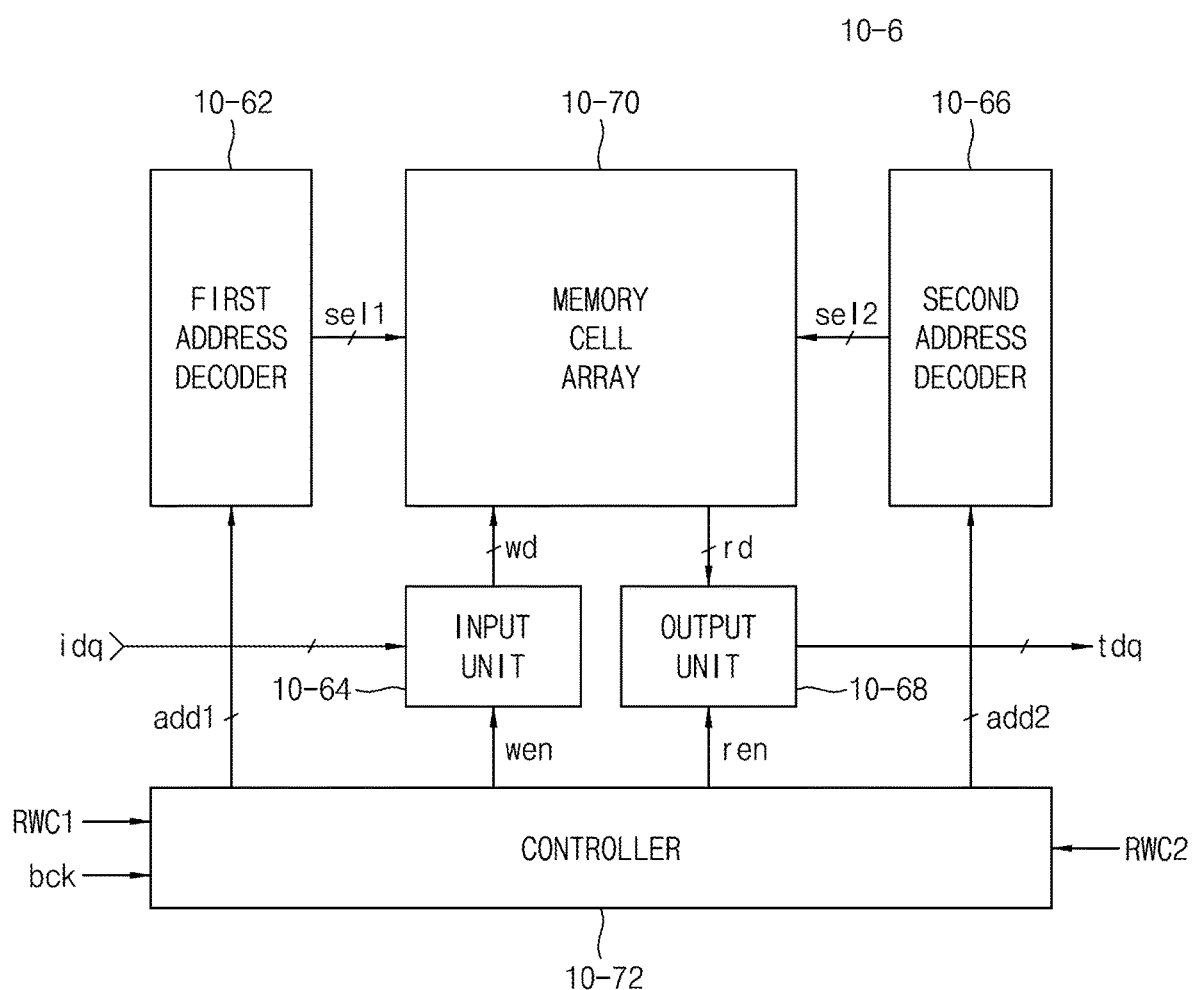
FIG. 7 is a block diagram illustrating a configuration of a storage according to some example embodiments of the inventive concepts.

FIG. 7 is a block diagram illustrating a configuration of the storage 10-6 according to some example embodiments of the inventive concepts. The storage 10-6 may include a first address decoder 10-62, an input unit 10-64, a second address decoder 10-66, an output unit 10-68, a memory cell array 10-70, and a controller 10-72. The storage 10-6 shown in FIG. 7 may be a dual port memory including a first port configured to receive the third plurality of bits of data idq and a second port configured to output the fourth plurality of bits of data tdq. The first and second ports are not explicitly shown in FIG. 7, but the first port may be coupled to the input unit 10-64 and the second port may be coupled to the output unit 10-68. A function of each of the blocks shown in FIG. 7 is described below.

The first address decoder 10-62 may decode a first address add1 received from the controller 10-72 and based thereon may generate a first selection signal sel1 and transmit the first selection signal sel1 to the memory cell array 10-70.

The input unit 10-64 may receive the third plurality of bits of data idq and based thereon may generate a third plurality of bits of write data wd for transmission to the memory cell array 10-70, in response to a write enable signal wen received from the controller 10-72.

The second address decoder 10-66 may decode a second address add2 received from the controller 10-72 and based thereon may generate a second selection signal sel2 and transmit the second selection signal sel2 to the memory cell array 10-70.

The output unit 10-68 may receive the fourth plurality of bits of read data rd from the memory cell array 10-70 and based thereon may generate a fourth plurality of bits of data tdq, in response to a read enable signal ren received from the controller 10-72. The number of the fourth plurality of bits may be the same as or smaller than that of the third plurality of bits.

The memory cell array 10-70 may include a plurality of dual port memory cells, and may store the third plurality of bits of write data wd in selected memory cells in response to the first selection signal sel1. Additionally, or alternatively, the memory cell array 10-70 may output the fourth plurality of bits of read data rd from the selected memory cells in response to the second selection signal sel2.

The controller 10-72 may generate the write enable signal wen in response to a first read/write control signal RWC1, and may generate the read enable signal ren in response to a second read/write control signal RWC2. In some embodiments, the controller 10-72 may fix the first read/write control signal RWC1 to a first state (for example, a power supply voltage (or a ground voltage)) to activate the write enable signal wen, and fix the second read/write control signal RWC2 to a second state (for example, the ground voltage (or the power supply voltage)) to activate the read enable signal ren. Further, the controller 10-72 may generate the first address add1 and the second address add2 in response to the buffered clock signal bck. In some embodiments, the controller 10-72 may delay the first address add1 by a predetermined time to generate the second address add2. Accordingly, the storage 10-6 may sequentially store the third plurality of bits of data idq and sequentially output the fourth plurality of bits of data tdq, using a first-in first-out method. When the first address add1 and the second address add2 are the same, the number of the third plurality of bits and the number of the fourth plurality of bits may be the same, and when the first address add1 and the second address add2 are different from each other, the number of the fourth plurality of bits is smaller than the number of the third plurality of bits. For example, the number of the third plurality of bits may be 72, and the number of the fourth plurality of bits may be 8.

In some embodiments, the controller 10-72 may activate the write enable signal wen when the first read/write control signal RWC1 is fixed to the first state, and may activate the read enable signal ren when the second read/write control signal RWC2 having the second state is applied from the processing unit 10-8.

Figure 8:
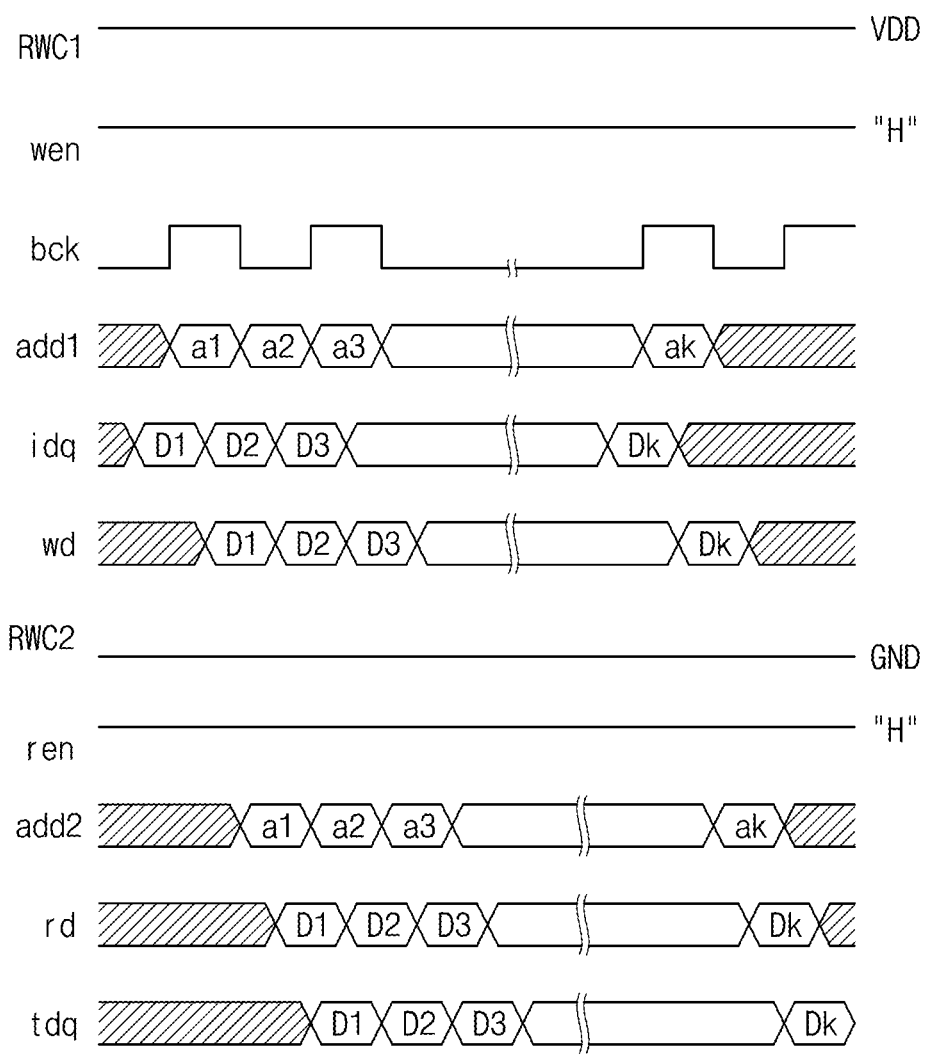
FIGS. 8 and 9 are operation timing diagrams for describing an operation of the storage according to some example embodiments of the inventive concepts.
Figure 9:
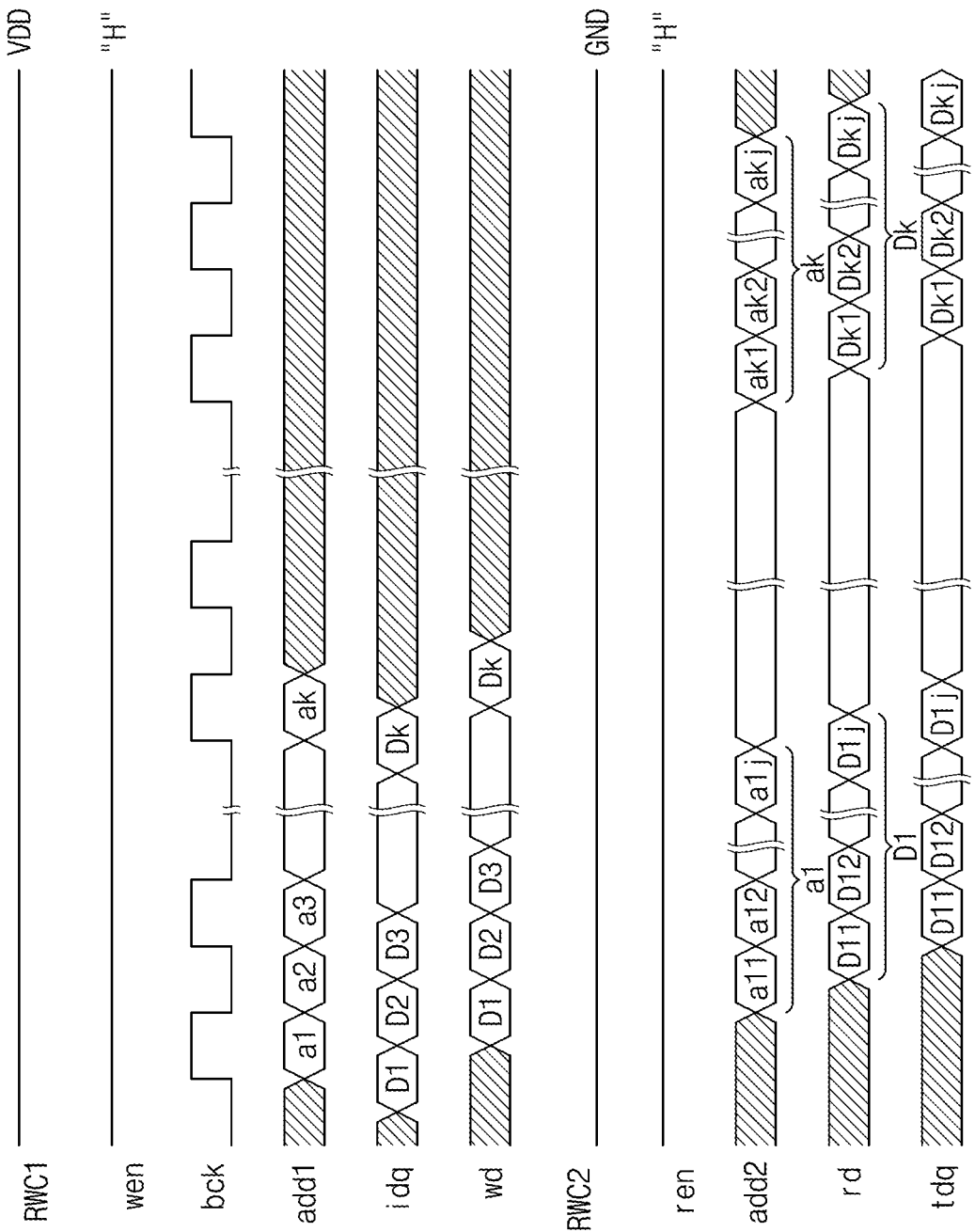
Figure 10:
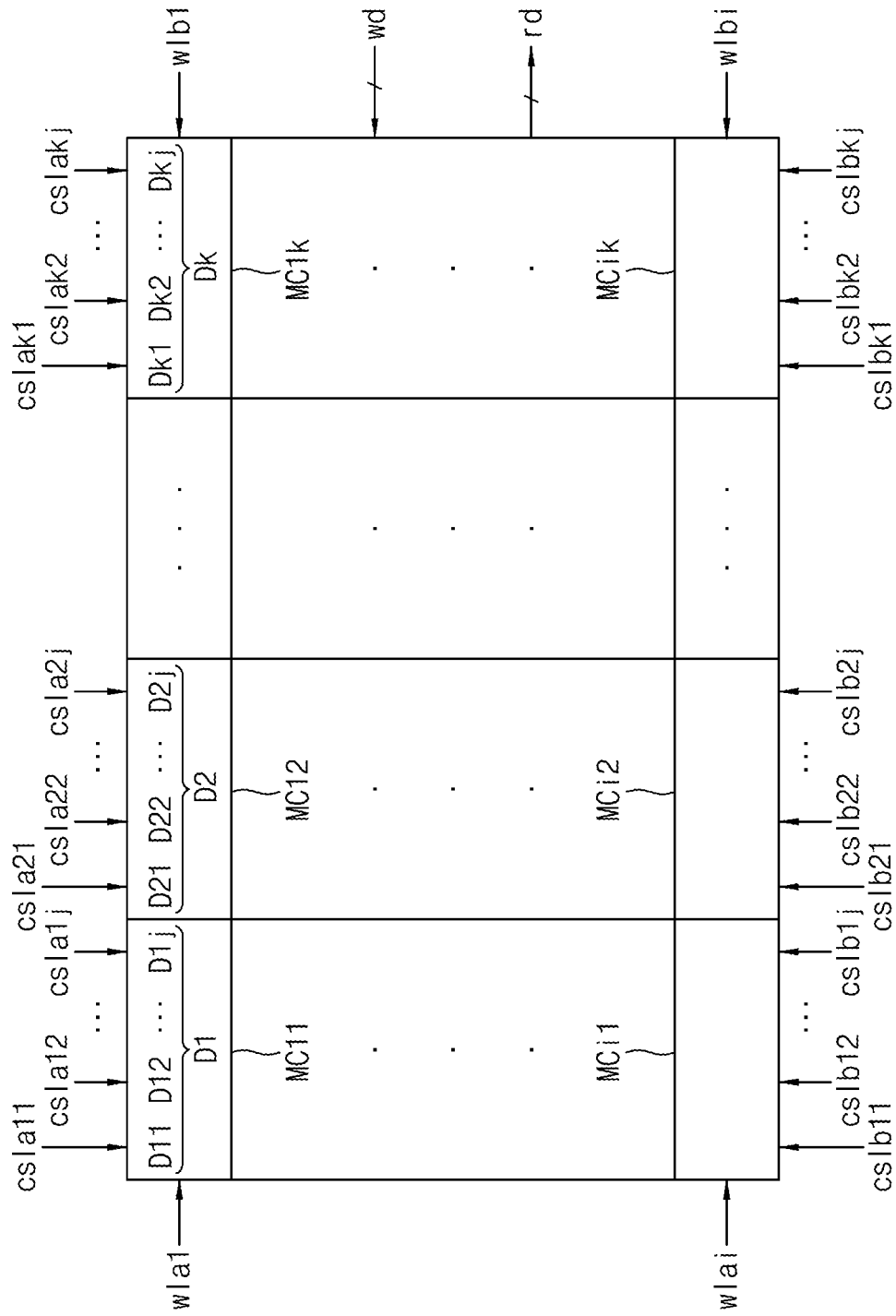
FIG. 10 illustrates a structure of a memory cell array and stored data according to some example embodiments of the inventive concepts.

FIGS. 8 and 9 are operation timing diagrams for describing an operation of the storage according to some example embodiments of the inventive concepts, and FIG. 10 illustrates data stored in storage regions of the memory cell array according to some example embodiments of the inventive concepts. FIGS. 8 to 10 are diagrams for describing an operation of the storage 10-6 when the third plurality of bits of data idq, which comprises data D1 to data Dk, are sequentially received from the control unit 100 shown in FIG. 1 by the memory module 200 shown in FIG. 1 in response to a rising edge and a falling edge of the buffered clock signal bck according to a DDR protocol, and the fourth plurality of bits of data tdq, which comprises data D1 to data Dk, are sequentially output. Here, the number of the fourth plurality of bits are the same as or smaller than that of the third plurality of bits.

A write operation of the storage 10-6 is described below with reference to FIGS. 7 to 10.

When the first read/write control signal RWC1 is fixed to a first voltage, such as the power supply voltage VDD, and the second read/write control signal RWC2 is fixed to a second voltage, such as the ground voltage GND, the controller 10-72 may generate the write enable signal wen having a "high" level and the read enable signal ren having a "high" level. That is, both the write enable signal wen and the read enable signal ren may be activated.

The controller 10-72 may generate the first address add1 which sequentially increases or decreases from an address a1 to an address ak in response to the rising edge and the falling edge of the buffered clock signal bck.

The input unit 10-64 may sequentially receive the third plurality of bits of data comprising data D1 to data Dk to sequentially generate the third plurality of bits of write data wd, in response to the write enable signal wen.

The first address decoder 10-66 may generate the first selection signal sel1 in response to the first address add1. The first address may include a first row address and a first column address, and one or more first word line selection signals wla1 to wlai may be generated based on the first row address, and one or more first column selection signals csla11 to cslakj may be generated based on the first column address. In some embodiments, j first column selection signals (csla11 to csla1j), . . . , or (cslak1 to cslakj) may be generated, which may correspond to one among k first column selection signal groups csla1 to cslak. Each of the j first column selection signals included in a corresponding group among the k first column selection signal groups csla1 to cslak may be activated, for example by neglecting or disregarding a predetermined number of upper or lower bits of the first column address. The first selection signal sel1 may include the generated first word line selection signals wla1 to wlai and the generated first column selection signals csla11 to cslakj.

As best seen in FIG. 10, in some embodiments, the memory cell array 10-70 may store a portion of the third plurality of bits of data D1 in memory cells (not shown) of a memory cell group MC11 selected by a first of the first word line selection signals (e.g., a signal wla1) and a first of the first column selection signal groups (e.g., signal group csla1, —which may include signals csla11 to csla1j). The third plurality of bits of data D1 may include j data D11 to D1j. Similarly, further portions of the third plurality of bits of data D2 to Dk may be sequentially stored in the memory cell groups MC12 to MC1k, which may be selected by the first of the first word line selection signals (.e.g., the signal wla1) and subsequent ones of the first column selection signal groups (e.g., signal groups csla2 to cslak). The third plurality of bits of data D2 to Dk may include j data (D21 to D2j), . . . , (Dk1 to Dkj), respectively.

A read operation of the storage 10-6 is described below with reference to FIGS. 7, 8, and 10.

The controller 10-72 may generate the second address add2, which may sequentially increase or decrease from the address a1 to the address ak from a time point delayed by a predetermined time (for example, shifted by 90 degrees) at a time point when the first address add1 is generated. For example, as seen in FIG. 8, the first address add1 may be increased from a1 to a2 on a falling edge of the buffered clock signal bck, and the second address add2 may be increased from a1 to a2 on the subsequent leading edge of the buffered clock signal bck (e.g., at a leading edge of the buffered clock signal where the first address add1 is being increased from a2 to a3).

The second address decoder 10-66 may generate the second selection signal sel2 in response to the second address add2. The second address add2 may include a second row address and a second column address, and one or more second word line selection signals wlb1 to wlbi may be generated by the second row address, and one or more second column selection signals cslb11 to cslbkj may be generated by the second column address. In some embodiments, j second column selection signals (cslb11 to cslb1j), . . . , or (cslbk1 to cslbkj) may correspond to one among the k second column selection signal groups cslb1 to cslbk. Each of the j second column selection signals included in a corresponding group among the k second column selection signal groups cslb1 to cslbk may be activated, for example, by neglecting or disregarding a predetermined number of upper or lower bits of the second column address. The second selection signal sel2 may include the generated second word line selection signals wlb1 to wlbi and the generated second column selection signals cslb11 to cslbkj.

The memory cell array 10-70 may output a portion of the fourth plurality of bits of data D1 from memory cells (not shown) of a memory cell group MC11 selected by a first of the second word line selection signals (e.g., a signal wlb1) and a first of the second column selection signal groups (e.g., a signal group cslb1, which may include signals cslb11 to cslb1j). The third plurality of bits of data D1 may include j data D11 to D1j. Similarly, further portions of fourth plurality of bits of data D2 to Dk stored in the memory cell groups MC12 to MC1k selected by the first of the second word line selection signals (e.g., the signal w1b1) and subsequent ones of the second column selection signal groups (e.g., signal groups cslb2 to cslbk) may be sequentially output. The third plurality of bits of data D2 to Dk may include j data (D21 to D2j), . . . , (Dk1 to Dkj), respectively.

Another read operation of the storage 10-6 is described below with reference to FIGS. 7, 9, and 10.

The controller 10-72 may generate the second address add2 which sequentially increases or decreases from an address a11 to an address akj from a time point delayed by a predetermined time (for example, shifted by 90 degrees) at a time point when the first address add1 is generated. For example, as seen in FIG. 8, the first address add1 may be increased from a1 to a2 on a falling edge of the buffered clock signal bck, and the second address add2 may be increased from a11 to a12 on the subsequent leading edge of the buffered clock signal bck (e.g., at a leading edge of the buffered clock signal where the first address add1 is being increased from a2 to a3).

The second address decoder 10-66 may generate the second selection signal sel2 in response to the second address add2. The second address add2 may include a second row address and a second column address, and one or more second word line selection signals wlb1 to wlbi may be generated by the second row address, and one or more second column selection signals cslb11 to cslbkj may be generated by the second column address. In some embodiments, the kj second column selection signals cslb11 to cslbkj may be sequentially activated by accounting for (e.g., without disregarding or neglecting) the predetermined number of upper or lower bits of the second column address. The second selection signal sel2 may include the generated second word line selection signals wla1 to wlbi and the generated second column selection signals cslb11 to cslbkj.

The memory cell array 10-70 may output a portion of the data D11 included in the fourth plurality of bits of data D1 stored in memory cells (not shown) of a sub group (not shown) of a memory cell group MC11 selected by a first of the second word line selection signals (e.g., a signal wlb1) and a first of the second column selection signal groups (e.g., a signal group cslb11). The third plurality of bits of data D1 may include j data D11 to D1j. Similarly, further portions of data D12 to D1j included in the fourth plurality of bits of data D1 stored in memory cells (not shown) of sub groups (not shown) of the memory cell groups MC11 selected by the first of the second word line selection signals (e.g., the signal wlb1) and subsequent ones of the second column selection signal groups (e.g., signal groups cslb12 to cslb1j) may be sequentially output. The data D21 to D2j, . . . , Dk1 to Dkj included in the fourth plurality of bits of data D2 to Dk stored in memory cells (not shown) of sub groups (not shown) of memory cell groups MC12 to MC1k may also be sequentially output.

That is, with reference to FIGS. 7 to 10, the storage 10-6 may sequentially store the third plurality of bits of data idq, and may sequentially output the fourth plurality of bits of data tdq, using the first-in first-out method. The number of the fourth plurality of bits may be the same as or smaller than that of the third plurality of bits.

In some embodiments, unlike shown, the second read/write control signal RWC2 may not be fixed, and even when a signal having a second state or second voltage (for example, a ground voltage level) is applied from the processing unit 10-8 shown in FIG. 3 to the controller 10-72, the storage 10-6 may perform the read operation as described above with reference to FIGS. 7 to 10.

Figure 11:
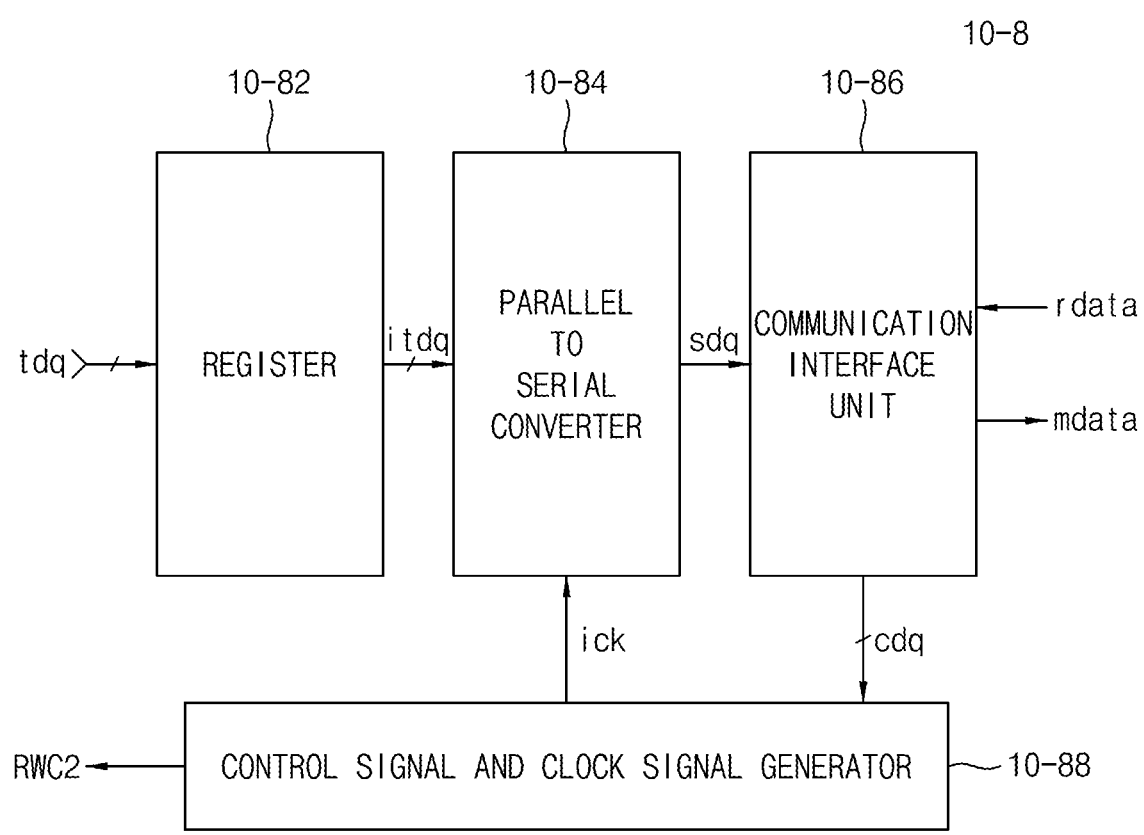
FIG. 11 is a block diagram illustrating a configuration of a processing unit according to some example embodiments of the inventive concepts.

FIG. 11 is a block diagram illustrating the processing unit 10-8 according to some example embodiments of the inventive concepts. The processing unit 10-8 may include a register 10-82, a parallel to serial converter 10-84, a communication interface unit 10-86, and a control signal and clock signal generator 10-88. A function of each of the blocks shown in FIG. 11 is described below.

The input unit 10-82 may receive and store the fourth plurality of bits of data tdq to generate a fifth plurality of bits of data itdq.

The parallel to serial converter 10-84 may convert the fifth plurality of bits of data itdq into serial data to sequentially generate one-bit serial data sdq, in response to an internal clock signal ick.

The communication interface unit 10-86 may receive reception data rdata to generate control data cdq, and may transmit the serial data sdq as the monitoring data mdata.

The control signal and clock signal generator 10-88 may set a state of the second read/write control signal RWC2 and a frequency of the internal clock signal ick by control data cdq, and may generate the internal clock signal ick. For example, the control data cdq may be data for setting a baud rate, a number of data bits, a number of parity bits, a number of end bits, a receiver usage permission, a transmitter usage permission, or the like. The frequency of the internal clock signal ick may be set by the baud rate, and the state of the second read/write control signal RWC2 may be set by the transmitter usage permission. Further, the number of bits of transmitted data may be set by the number of data bits. For example, the control signal and clock signal generator 10-88 may include a predetermined number of control registers (not shown) and a clock signal generator (not shown).

The processing unit 10-8 shown in FIG. 11 may generate the monitoring data mdata using a serial communication method. As an example, the processing unit 10-8 may be a universal synchronous/asynchronous receiver/transmitter (USART).

Figure 12:
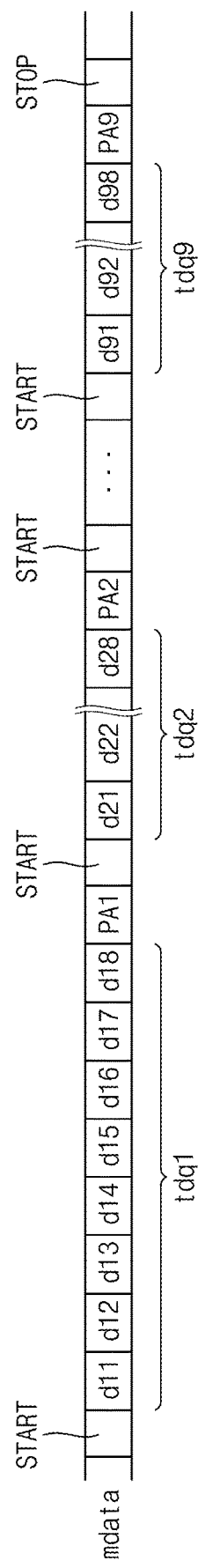
FIG. 12 illustrates a format of monitoring data output from the processing unit according to some example embodiments of the inventive concepts.

FIG. 12 illustrates a format of the monitoring data output from the processing unit according to some example embodiments of the inventive concepts. FIG. 12 illustrates a format when the number of data bits is set to 8, the number of end bits is set to 1, and the number of parity bits is set to 1, such that 9 8-bit data tdq1 to tdq9, that is, a total of 72-bit data, may be transmitted as the monitoring data mdata. However, the present disclosure is not limited thereto.

Referring to FIG. 12, 1-bit start data START, for example, "0", 8-bit data tdq1 (including d11~d18), and 1-bit parity bit PA1 with respect to the 8-bit data tdq1 may be sequentially transmitted by one bit. Next, 1-bit start bit START, 8-bit data tdq2 (including d21 to d28), and 1-bit parity bit with respect to the 8-bit data tdq2 may be sequentially transmitted by one bit. Lastly, 1-bit start bit START, 8-bit data tqd9 (d91 to d98), and 1-bit parity bit with respect to the 8-bit data tdq9 may be transmitted by one bit. When the transmission of the data is completed, 1-bit end data STOP, for example, "1", may be transmitted.

Figure 13:
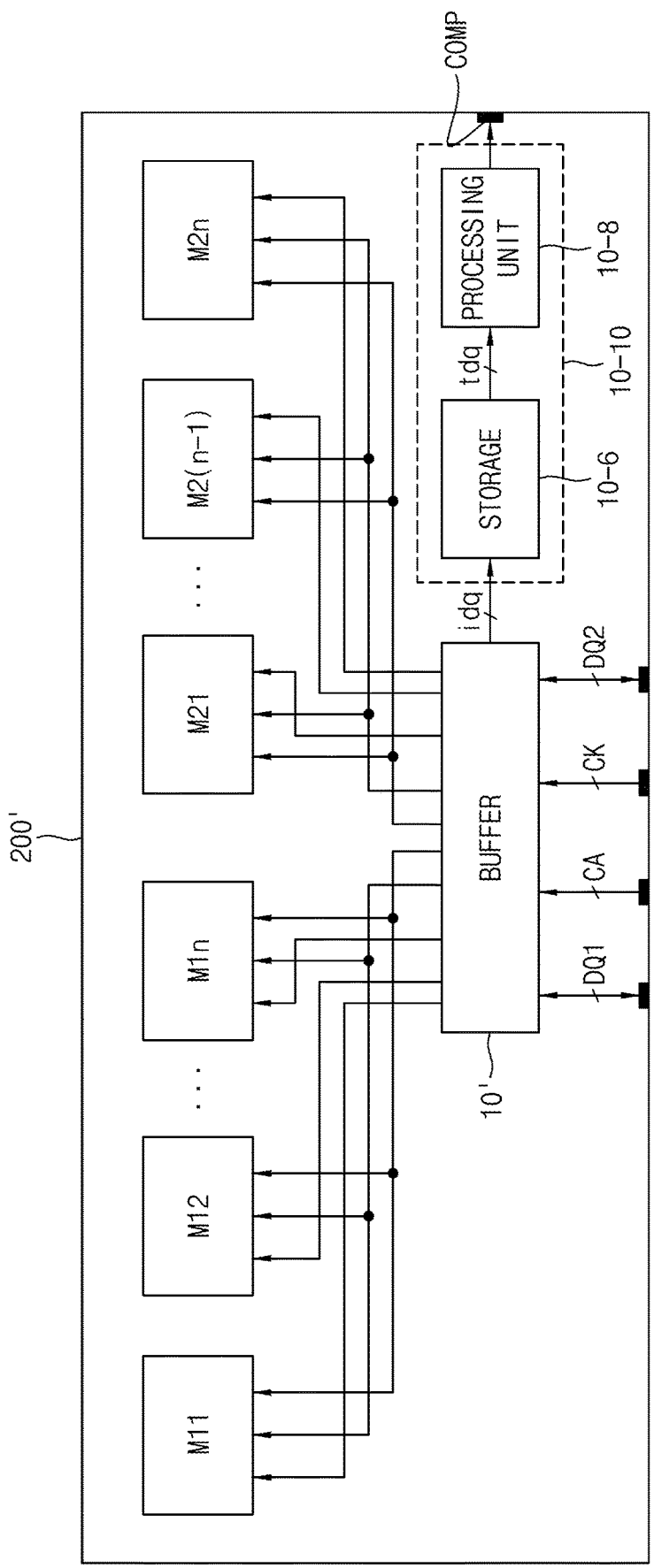
FIG. 13 is a block diagram illustrating a configuration of a memory module according to some example embodiments of the inventive concepts.

FIG. 13 is a block diagram illustrating a configuration of a memory module according to some example embodiments of the inventive concepts. Unlike the memory module 200 shown in FIG. 3, the memory module 200' may include the storage and processing unit 10-10 shown in FIG. 4 outside the buffer 10'. Although not shown, a buffer 10' shown in FIG. 13 may include the first interface unit 10-2 and the second interface unit 10-4 shown in FIG. 4.

A function and an operation of the memory module 200' shown in FIG. 13 may be easily understood with reference to the description described above with reference to FIGS. 1 to 12.

In some embodiments, the buffer 10, or the buffer 10' and the storage and processing unit 10-10, may store the at least one portion of the buffered write data and/or the at least one portion of the buffered command/address and generates the monitoring data mdata is described above. In some embodiments the buffer 10, or the buffer 10' and the storage and processing unit 10-10 may further store the buffered clock signal and include buffered clock signal in the monitoring data mdata.

Accordingly, a memory module can support a monitoring apparatus, which may enable easier monitoring of the data and/or the command/address by transmitting or forwarding the data and/or the command/address that is transmitted from the control unit to the memory module to the monitoring apparatus through a monitoring terminal.

While the disclosure has been particularly shown and described with reference to some example embodiments thereof, it will be apparent to those skilled in the art that various changes in form and detail may be made without departing from the scope of the inventive concepts of the present disclosure. The above embodiments are therefore to be construed in all aspects as illustrative and not restrictive.

What is claimed is:

1. A memory module comprising:
   a first plurality of terminals, comprising a plurality of command/address terminals;
   a second plurality of terminals, comprising a plurality of data terminals;
   at least one monitoring terminal;
   a buffer configured to receive and buffer a second plurality of bits of data applied through the data terminals to generate a second plurality of bits of buffered write data and configured to receive and buffer a first plurality of bits of command/address applied through the command/address terminals to generate a first plurality of bits of buffered command/address, wherein the buffer is further configured to buffer the second plurality of bits of buffered write data and the first plurality of bits of buffered command/address to generate module data and a module command/address, wherein the buffer is further configured to store at least one portion of the second plurality of bits of buffered write data, and wherein the buffer is further configured to transmit the stored at least one portion of the second plurality of bits of buffered write data as monitoring data through the at least one monitoring terminal; and
   a plurality of semiconductor memory devices configured to receive and store the module data in response to the module command/address.

2. The memory module of claim 1, wherein the buffer is further configured to store at least one portion of the first plurality of bits of buffered command/address, and wherein the buffer is further configured to transmit the stored at least one portion of the first plurality of bits of buffered command/address as the monitoring data through the at least one monitoring terminal.

3. The memory module of claim 1, wherein the buffer comprises:
   a first interface unit configured to buffer the second plurality of bits of data and the first plurality of bits of command/address to generate the second plurality of bits of buffered write data and the first plurality of bits of buffered command/address;
   a second interface unit configured to buffer the second plurality of bits of buffered write data and the first plurality of bits of buffered command/address to generate the module data and the module command/address; and
   a storage and processing unit configured to store the at least one portion of the second plurality of bits of buffered write data and transmit the stored at least one portion of the second plurality of bits of buffered write data as the monitoring data to the at least one monitoring terminal in series.

4. The memory module of claim 3, wherein the first interface unit comprises:
   a data input buffer configured to buffer the second plurality of bits of data to generate the second plurality of bits of buffered write data;
   a command/address input buffer configured to buffer the first plurality of bits of command/address to generate the first plurality of bits of buffered command/address; and a clock signal input buffer configured to buffer a clock signal to generate a buffered clock signal.

5. The memory module of claim 3, wherein the first interface unit is further configured to buffer a clock signal to generate a buffered clock signal, and the storage and processing unit comprises:
   a storage configured to store the at least one portion of the second plurality of bits of buffered write data and output the stored at least one portion of the second plurality of bits of buffered write data in response to the buffered clock signal; and
   a processing unit configured to receive the stored at least one portion of the second plurality of bits of buffered write data and convert the received data into serial data to generate the monitoring data.

6. The memory module claim 5, wherein the storage is a dual port memory including a first port and a second port, and wherein the dual port memory is configured to store the at least one portion of the second plurality of bits of buffered write data applied through the first port and output the stored at least one portion of the second plurality of bits of buffered write data through the second port, using a first-in first-out method.

7. The memory module of claim 5, wherein the storage is further configured to store the at least one portion of the first plurality of bits of buffered command/address and output the stored at least one portion of the first plurality of bits of buffered command/address, and wherein the processing unit is configured to receive the stored at least one portion of the first plurality of bits of buffered command/address and convert the received data to serial data.

8. A memory module comprising:
a first plurality of terminals, comprising a plurality of command/address terminals;
a second plurality of terminals, comprising a plurality of data terminals;
at least one monitoring terminal;
a buffer configured to receive and buffer data applied through the data terminals and a command/address applied through the command/address terminals, wherein the buffer is configured to generate buffered write data and a buffered command/address, and wherein the buffer is further configured to buffer the buffered write data and the buffered command/address to generate module data and a module command/address; and
a storage and processing unit configured to store at least one portion of the buffered write data, and configured to transmit the stored buffered write data as monitoring data through the at least one monitoring terminal; and
a plurality of semiconductor memory devices configured to receive and store the module data in response to the module command/address.

9. The memory module of claim 8, wherein the storage and processing unit is further configured to store at least one portion of the buffered command/address, and is configured to transmit the stored at least one portion of the buffered command/address to the at least one monitoring terminal.

10. The memory module of claim 8, wherein the buffer comprises:
a first interface unit configured to buffer the data and the command/address to generate the buffered data and the buffered command/address; and
a second interface unit configured to buffer the buffered write data and the buffered command/address to generate the module data and the module command/address.

11. The memory module of claim 10, wherein the first interface unit comprises:
a data input buffer configured to buffer the data to generate the buffered write data;
a command/address input buffer configured to buffer the command/address to generate the buffered command/address; and
a clock signal input buffer configured to buffer a clock signal to generate a buffered clock signal.

12. The memory module of claim 10, wherein the first interface unit is further configured to buffer a clock signal to generate a buffered clock signal, and wherein the storage and processing unit comprises:

a storage configured to store the at least one portion of the buffered write data and output the stored at least one portion of buffered write data in response to the buffered clock signal; and
a processing unit configured to receive the stored at least one portion of buffered write data and convert the received data into serial data to generate the monitoring data.

13. The memory module claim 12, wherein the storage is a dual port memory including a first port and a second port, and
wherein the dual port memory is configured to store the at least one portion of the buffered write data through the first port and output the stored at least one portion of the buffered write data through the second port, using a first-in first-out method.

14. The memory module of claim 12, wherein the processing unit is a universal synchronous/asynchronous transmitter/receiver (USART).

15. A memory system comprising:
a control unit comprising:
a processor configured to execute a program to generate an internal command, an internal address, and internal data,
a clock signal generator configured to generate a clock signal,
a command/address generator configured to receive the internal command and the internal address to generate a first plurality of bits of command/address, in response to the clock signal, and
a data output unit configured to receive the internal data to generate a second plurality of bits of data; and
a memory module comprising:
a first plurality of terminals, comprising a plurality of command/address terminals,
a second plurality of terminals, comprising a plurality of data terminals,
at least one monitoring terminal,
a buffer configured to receive and buffer the second plurality of bits of data applied through the data terminals and the first plurality of bits of command/address applied through the command/address terminals to generate a second plurality of bits of buffered write data and a first plurality of bits of buffered command/address, the buffer being further configured to buffer the second plurality of bits of buffered write data and the first plurality of bits of buffered command/address to generate module data and a module command/address,
a storage and processing unit configured to store at least one portion of the second plurality of bits of buffered write data, and transmit the stored at least one portion of the second plurality of bits of buffered write data as monitoring data through the at least one monitoring terminal, and
a plurality of semiconductor memory devices configured to receive and store the module data in response to the module command/address.

16. The memory system of claim 15, wherein the buffer is configured to further store at least one portion of the first plurality of bits of buffered command/address, and transmit the stored at least one portion of the first plurality of bits of buffered command/address as the monitoring data through the at least one monitoring terminal.

17. The memory system of claim 15, wherein the buffer comprises the storage and processing unit.

18. The memory system of claim 15, wherein the buffer comprises;
  a first interface unit configured to buffer the second plurality of bits of data and the first plurality of bits of command/address to generate the second plurality of bits of buffered write data and the first plurality of bits of buffered command/address; and
  a second interface unit configured to buffer the second plurality of bits of buffered write data and the first plurality of bits of buffered command/address to generate the module data and the module command/address; and
  a storage and processing unit configured to store the at least one portion of the second plurality of bits of buffered write data and transmit the stored at least one portion of the second plurality of bits of buffered write data as the monitoring data through the at least one monitoring terminal in series.

19. The memory system of claim 18, wherein the first interface unit is further configured to buffer the clock signal to generate a buffered clock signal, and wherein the storage and processing unit comprises:
  a storage configured to store the at least one portion of the second plurality of bits of buffered write data to output the stored at least one portion of the second plurality of bits of buffered write data, in response to the buffered clock signal; and
  a processing unit configured to receive the stored at least one portion of the second plurality of bits of buffered write data and convert the received data into serial data to generate the monitoring data.

20. The memory system of claim 19, wherein the storage is a dual port memory including a first port and a second port, wherein the dual port memory stores the at least one portion of the second plurality of bits of buffered write data through the first port and outputs the stored at least one portion of the second plurality of bits of buffered write data through the second port using a first-in first-out method, and wherein the processing unit is a universal synchronous/asynchronous transmitter/receiver (USART).

* * * * *